(12) United States Patent
Guentert

(10) Patent No.: US 9,961,806 B2
(45) Date of Patent: May 1, 2018

(54) SYSTEMS AND METHODS FOR TRANSFORMER COOLING BY VERTICAL AIRFLOW

(71) Applicant: Power Distribution Systems Development LLC, Wilmington, DE (US)

(72) Inventor: Joseph M. Guentert, Cincinnati, OH (US)

(73) Assignee: Power Distribution Systems Development LLC, Wilmington, DE (US)

( * ) Notice: Subject to any disclaimer, the term of this patent is extended or adjusted under 35 U.S.C. 154(b) by 0 days. days.

(21) Appl. No.: 15/159,099

(22) Filed: May 19, 2016

(65) Prior Publication Data

US 2017/0339806 A1  Nov. 23, 2017

(51) Int. Cl.
*H05K 7/20* (2006.01)
*H01F 27/02* (2006.01)
*H01F 27/08* (2006.01)
*H01L 23/473* (2006.01)

(52) U.S. Cl.
CPC ......... *H05K 7/20909* (2013.01); *H01F 27/02* (2013.01); *H01F 27/08* (2013.01); *H05K 7/209* (2013.01)

(58) Field of Classification Search
CPC . G06F 1/181–1/182; H05K 7/20218–7/20381; H05K 7/20409–7/20418; H05K 7/20009–7/202; H05K 7/20909; H05K 7/209; H01L 23/367–23/3677; H01L 23/473; H01L 23/46–23/467; H01F 27/02; H01F 27/08

USPC ...... 361/676–678, 679.46–679.54, 688–723; 165/80.1–80.5, 104.33, 185; 174/15.1–15.3, 16.1–16.3, 547, 548;
(Continued)

(56) References Cited

U.S. PATENT DOCUMENTS

| 3,205,938 A | 9/1965 | Robinson |
| 4,266,602 A | 5/1981 | White et al. |
| 4,911,231 A | 3/1990 | Horne et al. |

(Continued)

FOREIGN PATENT DOCUMENTS

| CN | 201584261 | 9/2010 |
| GB | 1196390 | 6/1970 |

*Primary Examiner* — Anthony Haughton
*Assistant Examiner* — Razmeen Gafur
(74) *Attorney, Agent, or Firm* — Dinsmore & Shohl LLP

(57) ABSTRACT

Systems and methods for transformer cooling by vertical airflow are described. One embodiment of an air transfer unit includes an assembly frame that includes an interior portion and defines a lateral side, an upper side, and a lower side, where the assembly frame includes a length that is substantially the same as a width of a plurality of cooling fins on a transformer. Some embodiments include a plurality of air directing apparatuses that are positioned in the interior portion and are aligned along the length of the assembly frame, where the plurality of air directing apparatuses receive airflow from the lateral side and direct the airflow vertically through the upper side to further cool the plurality of cooling fins. Similarly, some embodiments include an exhaust screen that is coupled to the upper side, wherein the exhaust screen further consolidates the airflow vertically toward the plurality of cooling fins.

20 Claims, 8 Drawing Sheets

(58) Field of Classification Search
USPC ... 257/712–722, E23.088; 24/453, 458–459; 454/184; 312/234
See application file for complete search history.

(56) References Cited

U.S. PATENT DOCUMENTS

| | | | |
|---|---|---|---|
| 2001/0032718 A1 | 10/2001 | Sheerin et al. | |
| 2002/0006027 A1* | 1/2002 | Rodriguez | H05K 7/20909 361/688 |
| 2002/0134531 A1* | 9/2002 | Yanagida | G06F 1/18 165/80.3 |
| 2004/0114326 A1* | 6/2004 | Dodgen | H05K 7/206 361/694 |
| 2005/0162828 A1* | 7/2005 | Shieh | F04D 29/424 361/695 |
| 2005/0174737 A1* | 8/2005 | Meir | G06F 1/20 361/697 |
| 2005/0286226 A1* | 12/2005 | Ishii | H01L 23/467 361/697 |
| 2006/0021733 A1* | 2/2006 | Huang | H01L 23/4093 165/80.3 |
| 2006/0196643 A1* | 9/2006 | Hata | G06F 1/1616 165/104.33 |
| 2007/0247811 A1* | 10/2007 | Ohmi | H05K 7/20909 361/697 |
| 2008/0037219 A1* | 2/2008 | Chen | H05K 7/20909 361/695 |
| 2008/0037222 A1* | 2/2008 | Jha | H05K 7/20445 361/709 |
| 2008/0055845 A1* | 3/2008 | Murakami | H05K 7/20754 361/679.48 |
| 2008/0144279 A1* | 6/2008 | Yamamoto | H05K 7/20918 361/694 |
| 2009/0021910 A1* | 1/2009 | Lai | H05K 7/20181 361/695 |
| 2009/0195983 A1* | 8/2009 | Reichert | G06F 1/203 361/697 |
| 2009/0294171 A1* | 12/2009 | Chen | G06F 1/20 174/547 |
| 2010/0039771 A1* | 2/2010 | Marchand | H05K 7/20909 361/694 |
| 2012/0026770 A1* | 2/2012 | West | H05K 7/209 363/131 |
| 2013/0128450 A1* | 5/2013 | Redshaw | F24F 13/068 361/679.46 |
| 2014/0078670 A1* | 3/2014 | Tang | G06F 1/183 361/679.48 |
| 2014/0092556 A1* | 4/2014 | Turney | H05K 7/20154 361/696 |
| 2015/0009630 A1* | 1/2015 | Tuen | H01L 23/00 361/714 |
| 2015/0250077 A1* | 9/2015 | Endo | H05K 7/20745 361/679.47 |
| 2015/0261268 A1* | 9/2015 | Gong | G06F 1/206 361/679.5 |
| 2015/0319883 A1* | 11/2015 | Branton | H05K 7/20754 361/679.53 |
| 2015/0355533 A1* | 12/2015 | Masuda | G03B 21/16 353/52 |
| 2016/0044827 A1* | 2/2016 | Proctor | H05K 7/20127 361/692 |
| 2016/0088775 A1* | 3/2016 | Bailey | B21D 53/022 361/679.47 |
| 2016/0192542 A1* | 6/2016 | LeFebvre | H05K 7/20836 361/679.47 |
| 2016/0381836 A1* | 12/2016 | Hall | H05K 7/20718 361/679.48 |

* cited by examiner

SYSTEMS AND METHODS FOR TRANSFORMER COOLING BY VERTICAL AIRFLOW

TECHNICAL FIELD

Embodiments described herein generally relate to forced-air transformer cooing and, more specifically, to vertical-flow forced-air cooling of a transformer.

BACKGROUND

Transformers may be utilized to convert voltage from one form of another. As a result, transformers typically generate excess heat that needs to be routed away from the transformer. While many transformers are often placed outdoors, thus reducing the space constraints for the machinery required to effectively remove heat; indoor transformers are becoming relevant where space constraints are more significant. With indoor transformers, not only is cooling an issue, but indoor transformers are typically subject to space restrictions. The room that indoor transforms reside is often limited specially. As a result, cooling must also be space economical.

Traditional liquid-filled transformers often utilize large radiator banks that cool the internal liquid of the transformer via natural convection of ambient air over the radiators. Traditional radiator banks are typically oriented perpendicular to an exterior surface of the transformer, and include finned surfaces oriented parallel to the transformer external surfaces. These radiator banks are usually spaced a few inches apart and span the entire surface of the transformer. As the radiator banks typically extend outward from the surface, the radiator banks extend the footprint of the transformer. As a consequence, the radiator banks often increase the space taken by the transformer. Additionally, the radiator banks often do not provide the desired cooling. Thus, a need exists in the industry.

SUMMARY

Systems and methods for transformer cooling by vertical airflow are described. One embodiment of an air transfer unit includes an assembly frame that includes an interior portion and defines a lateral side, an upper side, and a lower side, where the assembly frame includes a length that is substantially the same as a width of a plurality of cooling fins on a transformer. Some embodiments include a plurality of air directing apparatuses that are positioned in the interior portion and are aligned along the length of the assembly frame, where the plurality of air directing apparatuses receive airflow from the lateral side and direct the airflow vertically through the upper side to further cool the plurality of cooling fins. Similarly, some embodiments include an exhaust screen that is coupled to the upper side, wherein the exhaust screen further consolidates the airflow vertically toward the plurality of cooling fins.

In another embodiment, a system includes a transformer that converts received electricity from a first voltage to a second voltage, where the transformer includes a plurality of cooling fins that extend from a surface of the transformer and have a length that extends to define a lower surface of the plurality of cooling fins. In some embodiments, the lower surface defines a lower clearance space between the lower surface and ground, and where the plurality of cooling fins collectively define a cooling fin width. Some embodiments include an air transfer unit that resides in the lower clearance space and extends across at least a portion of the cooling fin width, under the lower surface of the plurality of cooling fins. Embodiments of the air transfer unit include an assembly frame that includes an interior portion and defines a lateral side, an upper side, and a lower side, and where the assembly frame includes a height that is substantially the same as a distance between the lower surface that is defined by the plurality of cooling fins and ground. Some embodiments of the air transfer unit may include a plurality of air directing apparatuses that are positioned in the interior portion and are aligned along the length of the assembly frame, where the plurality of air directing apparatuses receive airflow from the lateral side and direct the airflow vertically through the upper side along the length of the plurality of cooling fins to further cool the plurality of cooling fins. Similarly, some embodiments of the air transfer unit include an exhaust screen that is constructed of low blockage honeycomb structure, where the exhaust screen is removably coupled to the upper side, and where the exhaust screen further consolidates the airflow vertically toward the plurality of cooling fins.

In yet another embodiment, a transformer includes a plurality of cooling fins that extend from a surface of the transformer and have a length that extends to define a lower surface of the plurality of cooling fins, where the lower surface defines a lower clearance space between the lower surface and ground, and where the plurality of cooling fins collectively define a cooling fin width. The transformer may include an air transfer unit that resides in the lower clearance space and extends across at least a portion of the cooling fin width, under the lower surface of the plurality of cooling fins. The air transfer unit may include an assembly frame that includes an interior portion and defines a lateral side, an upper side, and a lower side, and wherein the assembly frame includes a height that is substantially the same as a distance between the lower surface that is defined by the plurality of cooling fins and ground. Some embodiments of the air transfer unit include a plurality of air directing apparatuses that are positioned in the interior portion and are aligned along the length of the assembly frame, where the plurality of air directing apparatuses receive airflow from the lateral side and direct the airflow vertically through the upper side along the length of the plurality of cooling fins to further cool the plurality of cooling fins. Some embodiments of the air transfer unit include an exhaust screen that is constructed of low blockage honeycomb structure, where the exhaust screen is removably coupled to the upper side, and where the exhaust screen further consolidates the airflow vertically toward the plurality of cooling fins. Some embodiments of the air transfer unit include a screened intake filter that is coupled to the lateral side, where the screened intake filter reduces debris from reaching the interior portion.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein include systems and methods for vertical transformer cooling. Some embodiments may include an air transfer unit that is positioned perpendicular to typical heat transfer of the transformer. Specifically, some transformers, typically of smaller size (9000 kVA or smaller), may utilize cooling fins oriented perpendicular to the transformer tank wall. The plurality of cooling fins may be welded to the transformer tank wall (sometimes called "corrugate fins"), which reduce space taken by the radiator bank. While these fins may provide some heat transfer, oftentimes, greater heat transfer is desired. Accordingly, embodiments of the present disclosure are configured with one or more vertically directed air directing apparatuses that are used to cool the corrugate fins.

To achieve the most efficient flow of cooling air, the air transfer unit may include a plurality of air directing apparatuses mounted below and/or above the transformer fins. In some embodiments, the air directing apparatuses may be configured as fans that are assembled in a single plenum, directly below the plurality of cooling fins of the transformer. The plenum may be sized to be substantially the same as a cooling fin width, which is the width of the transformer fin bank, and substantially the depth of the fins. In some embodiments, air directing apparatuses on both the top and bottom are provided, which both direct air flow in the same direction and/or at least one of the air directing apparatuses may be directed perpendicular to the other air directing apparatuses to direct airflow according to a desired path.

The air transfer unit may be constructed as part of the transformer or as an after-market add-on. Regardless, the air transfer unit may be coupled to a thermostat and/or logic for activating the air transfer unit when the corrugate fins and/or transformer reach a predetermined temperature. The air transfer unit may also include an assembly frame and exhaust screens that may be removable. The systems and methods for vertical transformer cooling incorporating the same will be described in more detail, below.

Figure 1:
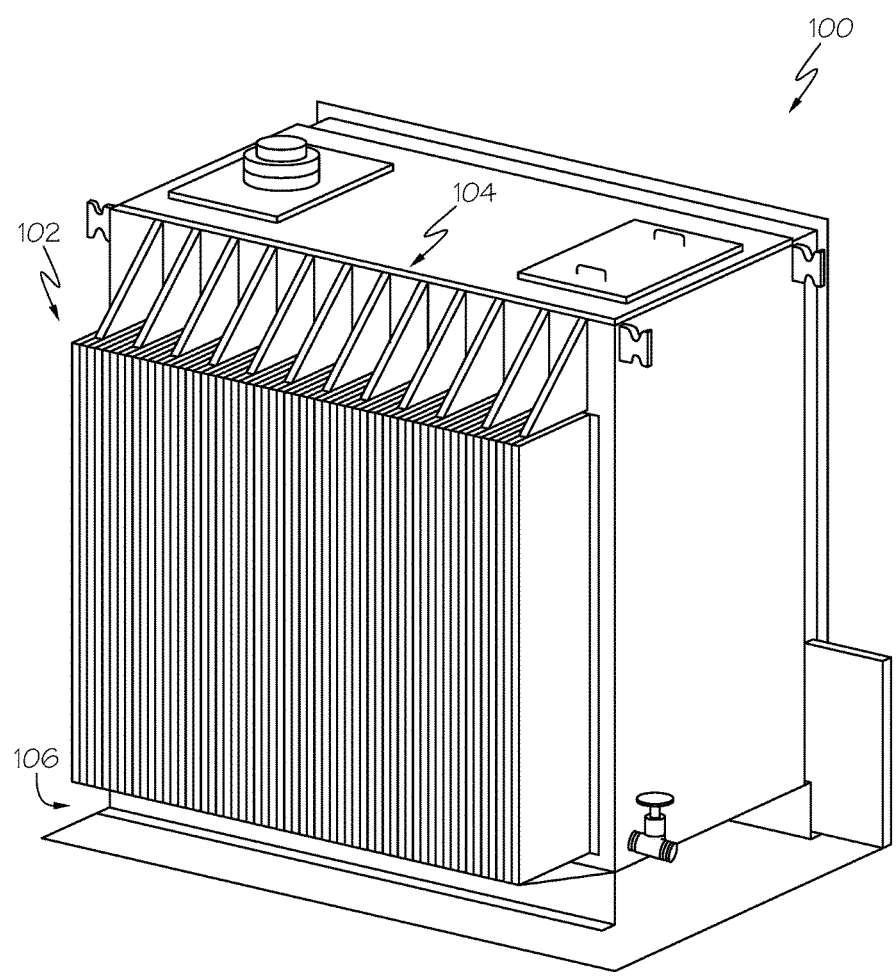
FIG. 1 depicts a transformer with cooling fins, according to embodiments described herein.

Referring now to the drawings, FIG. 1 depicts a transformer 100 with cooling fins 102, according to embodiments described herein. As illustrated, the transformer 100 may be configured for converting electrical power from a first voltage into a second voltage. As discussed above, the transformer 100 may be configured as an indoor transformer that operates between about 750 kilo-Volt-Ampere (kVA) and about 5000 kVA. Some embodiments of the transformer may be configured as an indoor-liquid transformer designed for indoor use in a data center. Specifically, the liquid insulator may include FR3 or other dielectric fluid.

Accordingly, while previous solutions utilize radiator banks that extend outward from a back of the transformer 100, embodiments of the transformer 100 may include cooling fins 102 that may be attached to back portion of the transformer 100. The cooling fins 102 may be coupled to a tubing system that circulates FR3 fluid. Specifically, a transformer coil generates heat based on the voltage conversion. The heat is transferred to the FR3 fluid in internal transformer chamber. The heated FR3 fluid is communicated from the internal transformer chamber thought the exterior tubing system, which is in contact with the cooling fins 102. The cooling fins 102 may have a large surface area to communicate the heat to the ambient air. The cooling fins 102 may be coupled to cooling structures 104, which may further secure the cooling fins 102 to the transformer, as well as provide additional surface area for dissipating heat from the transformer 100.

Unlike larger transformers with radiator banks, cooling fins 102 are typically much closer to the transformer seating surface—usually a concrete pad—providing a lower clearance space 106 of about 6 inches to about 9 inches of clearance. Additionally, because the cooling fins 102 are may be about 10 inches to about 16 inches in depth from the transformer 100, embodiments may be configured to provide a high density flow of uniform cooling air (flow per square inch of fin area), close to the tank wall. Similarly, embodiments provided herein may create a flow velocity of at least about 20 feet per second to about 30 feet per second to cool the transformer 100.

As also illustrated in FIG. 1, the cooling fins 102 may be disposed substantially across the width of the transformer 100. Additionally, the cooling fins 102 may be oriented in a vertical direction, such that a primary surface of the cooling fins 102 faces perpendicular relative to ground and a secondary surface (e.g., the edges of the cooling fins 102 that face outward from the transformer 100) is directed vertical to ground. As such, the plurality of cooling fins 102 together define a clearance surface that is substantially parallel to ground and creates a lower clearance space 106 that provides a predetermined distance (e.g., about 6 inches to about 9 inches) for allowing the flow of air under the cooling fins 102, thereby increasing cooling of the transformer 100. The cooling structures 104 may be disposed on a top surface that is defined by the plurality of cooling fins 102. The cooling structures 104 may be disposed substantially parallel and may be arranged substantially vertical relative to ground.

Figure 2:
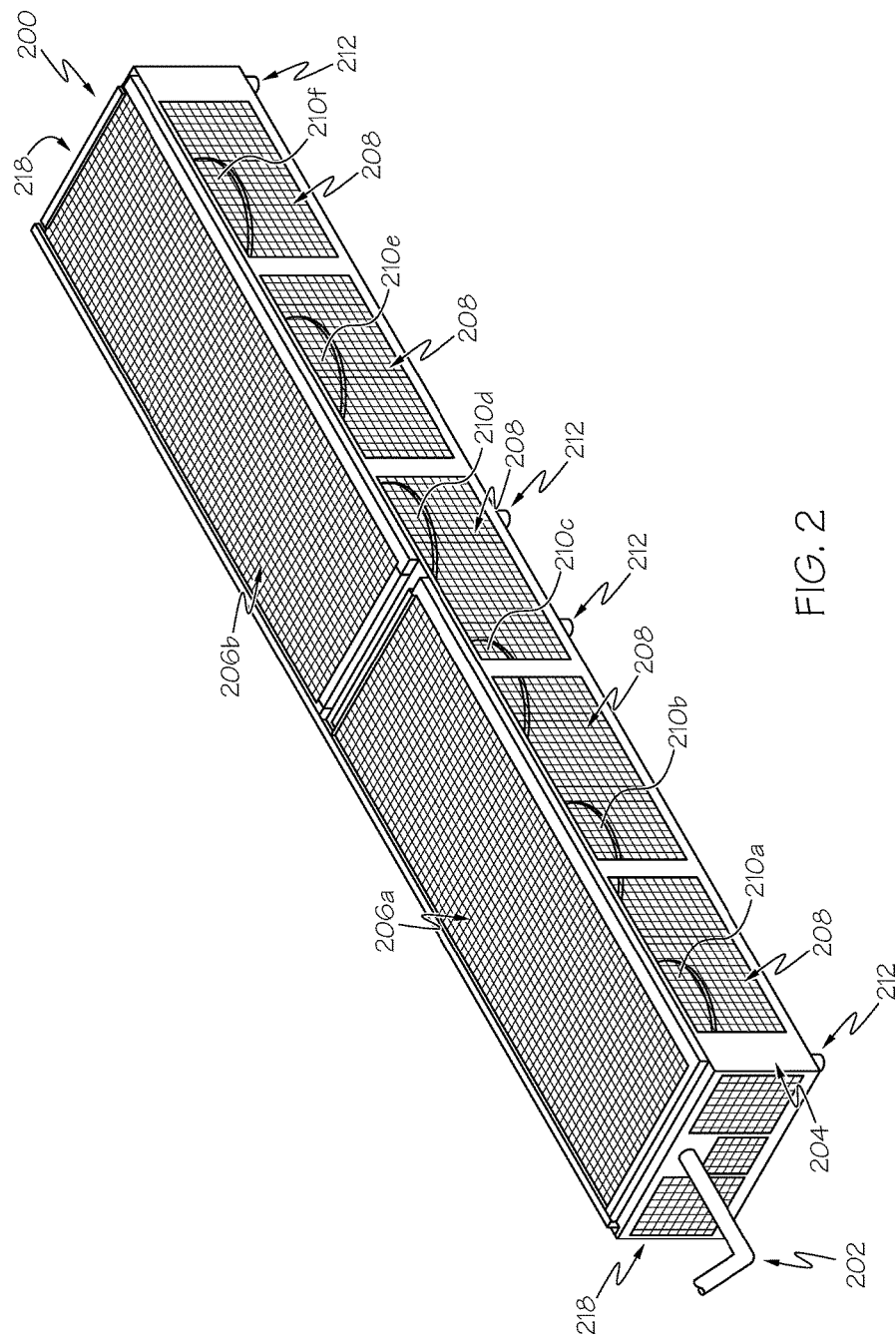
FIG. 2 depicts an air transfer unit, according to embodiments described herein.

FIG. 2 depicts an air transfer unit 200, according to embodiments described herein. As illustrated, the air transfer unit 200 may be configured to further aid cooling of the transformer 100 by increasing air flow across the cooling fins 102 (FIG. 1). Specifically, the air transfer unit 200 may include a power supply apparatus 202, an assembly frame 204, at least one exhaust screen 206a, 206b, at least one screened intake filter 208, at least one air directing apparatus 210, at least one elevation support 212, and a sidewall 218.

The power supply apparatus 202 may include an alternating current (AC) or direct current (DC) power cord that is configured to couple with a power source, such as a battery, an outlet and/or other portion of the transformer 100, as described in more detail below. The power supply apparatus 202 may provide power to the air directing apparatus 210 for facilitating movement of air across the primary surfaces of the cooling fins 102. Additionally, the assembly frame 204 may be configured as a rectangular (or other shape) structure that is configured to securely maintain integrity of the air directing apparatuses 210, as well as any support structure, motors, and/or other hardware that is utilized for directing air as described herein. The assembly frame 204 may include one or more solid portions, such as at corners and/or edges that provide stability to the assembly frame 204. Similarly, some embodiments include solid support structures at other places on the assembly frame 204 to increase stability and/or perform other functions.

Accordingly, at least one surface of the assembly frame 204 may be configured to receive one or more exhaust screen 206a, 206b. In some embodiments, the exhaust screens 206a, 206b may be configured for preventing objects from entering an interior portion of the air transfer unit 200 and/or for directing airflow in a predetermined direction. Specifically, the exhaust screens 206a, 206b depicted in FIG. 2 are received on an upper surface of the air transfer unit 200, with the intended direction of air flow to be out through the exhaust screens 206a, 206b. As the overall direction of airflow from the air directing apparatus 210 may generally be correct, the airflow may have some unintended direction, which may be corrected by the exhaust screens 206a, 206b. Depending on the embodiment, the exhaust screens 206a, 206b may be constructed of wire mesh, fiberglass, and/or other screen or filtering material.

Also illustrated in FIG. 2 are screened intake filters 208. The screened intake filters 208 may be disposed on lateral surfaces of the air transfer unit 200 and/or on a lower surface (not visible in FIG. 2). The screened intake filters 208 may be sized and shaped to be removably and/or permanently attached to the assembly frame 204 and may be configured for receiving ambient air. The screened intake filters 208 may be construed of wire mesh, fiberglass, and/or other material that prevents objects from entering the interior portion of the air transfer unit 200, while allowing sufficient ambient air to enter.

The air directing apparatuses 210 may be disposed in the interior portion of the air transfer unit 200 and may be aligned along the length of the air transfer unit 200. The air directing apparatuses 210 may include fans, such as a bladed fan, a bladeless fan, a centrifugal blower, an axial flow fan, etc. Also provided are the elevation supports 212. The elevation supports 212 may be included to provide a higher coefficient of friction between the air transfer unit 200 and the ground, as well as to elevate a lower surface of the air transfer unit 200 a predetermined distance from the ground. Specifically, some embodiments may be configured with the lower surface of the air transfer unit 200 directly on the ground, with the air intake being handled via the side surfaces of the air transfer unit 200 via the screened intake filters 208. However, some embodiments may also utilize the lower surface and thus an air canal between the lower surface and the ground may be desired. As discussed in more detail below, the elevation supports 212 may vary in height, depending on the desired elevation of the air transfer unit 200.

As an example, the air transfer unit 200 may be configured to provide about 5000 CFM/30 feet-per-second velocity of airflow with only about 9 inches of clearance. In this example, the air transfer unit 200 may include six, 10 inch diameter 870 CFM axial fans that each includes thermal shutoff circuitry to prevent overheating. The fans may exhaust air at about 30 feet per second. The smaller diameter of the fans relative to typical industry fans allows the fans to fit entirely inside the air transfer unit 200 and discharge all airflow into the cooling fins 102 (FIG. 1).

In this example, the fans may be positioned at maximum density/minimum pitch between fan centerlines of about 12 inches. This is the maximum density that can fit within the approximate 75 inch span of the cooling fins 102, while still allowing clearance between fan housings for mounting. Also in this example, the fans may be positioned to create a clearance for intake airflow—between the underside of the fan and the lower surface of the air transfer unit 200. Other examples are also included within the scope of this disclosure.

Figure 3:
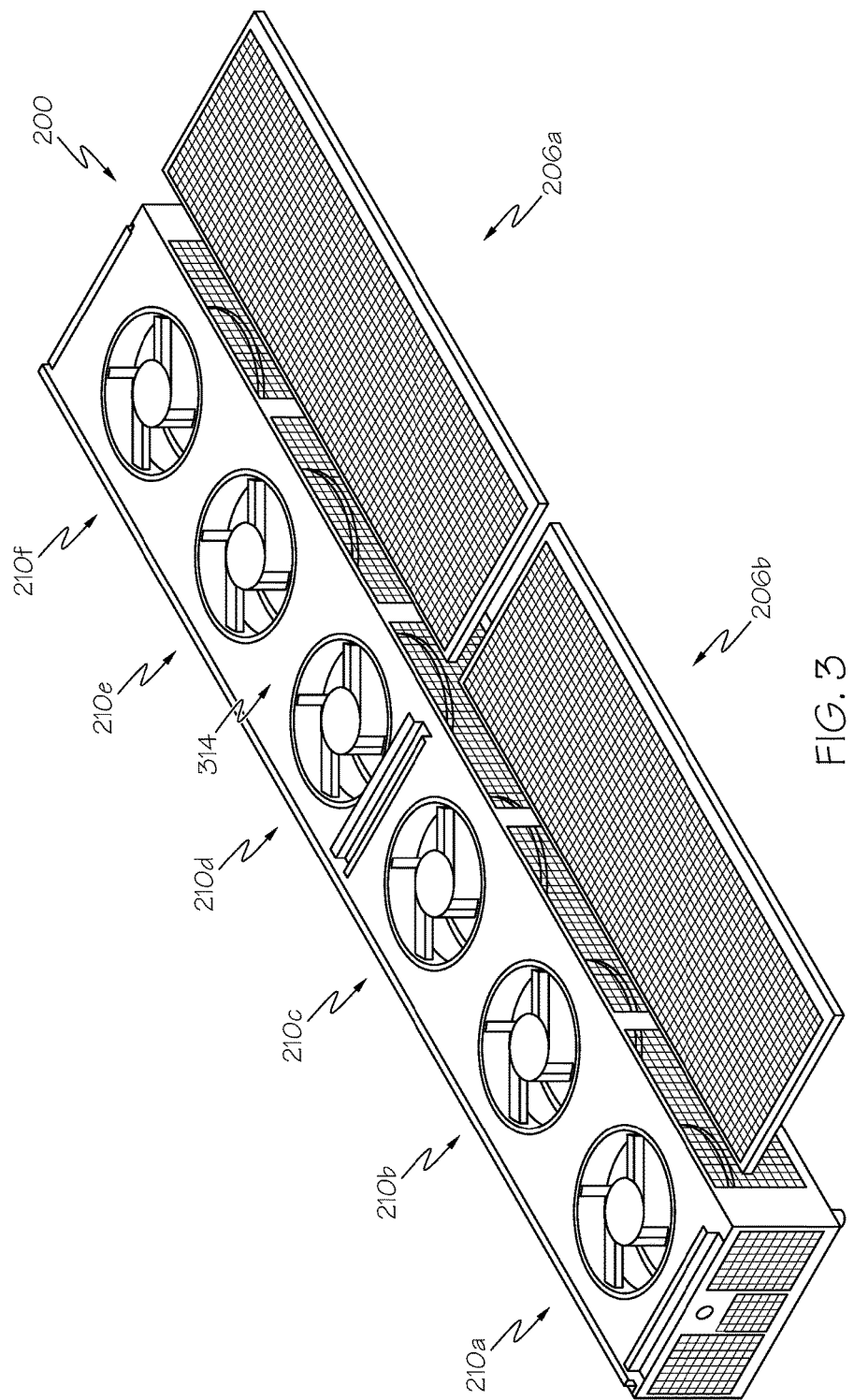
FIG. 3 depicts a plurality of air directing apparatuses that are utilized in the air transfer unit, according to embodiments described herein.

FIG. 3 depicts a plurality of air directing apparatuses 210 that are utilized in the air transfer unit 200, according to embodiments described herein. As illustrated, the air transfer unit 200 may include the exhaust screens 206a, 206b, which may be removable. While some embodiments may be permanent, removing the exhaust screens 206a, 206b may provide access to the air directing apparatuses 210a-210f. Regardless, the exhaust screens 206a, 206 may be removably and/or permanently secured in the interior portion of the air transfer unit 200 via an interior frame portion 314.

In some embodiments, the exhaust screens 206a, 206b may be removably coupled to the assembly frame 204 via tabs on the assembly frame 204 and/or the interior frame portion 314. This allows the exhaust screens 206a, 206b to slide off and onto the air transfer unit 200. Other embodiments may utilize different securing mechanisms as will be understood.

Figure 4:
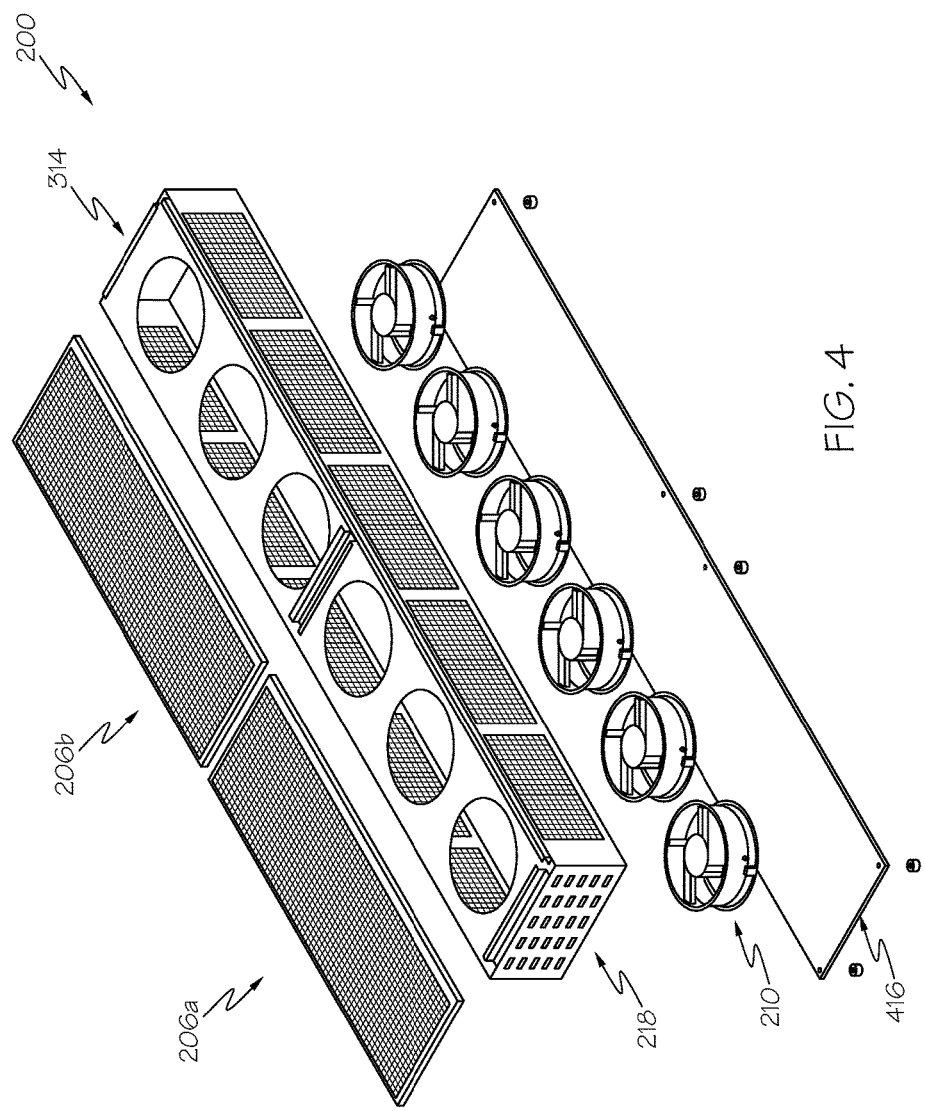
FIG. 4 depicts an exploded view of the air transfer unit, according to embodiments described herein.

FIG. 4 depicts an exploded view of the air transfer unit 200, according to embodiments described herein. As illustrated, the air transfer unit 200 may be disassembled to illustrate the component parts. Additionally, the lower surface 416 and an opposite sidewall 218 (from that depicted in FIGS. 2 and 3) are depicted. As described above, the lower surface 416 may be a solid member in embodiments that utilize the screened intake filters 208 on the lateral surfaces of the air transfer unit 200 for all intake airflow. However, embodiments that utilize additional air intake (or output) may utilize the lower surface 416, which may be constructed of a mesh material or other material for receiving intake airflow or outputting airflow. Similarly, the sidewall 218 may include air intake apertures for receiving additional intake of airflow.

Figure 5:
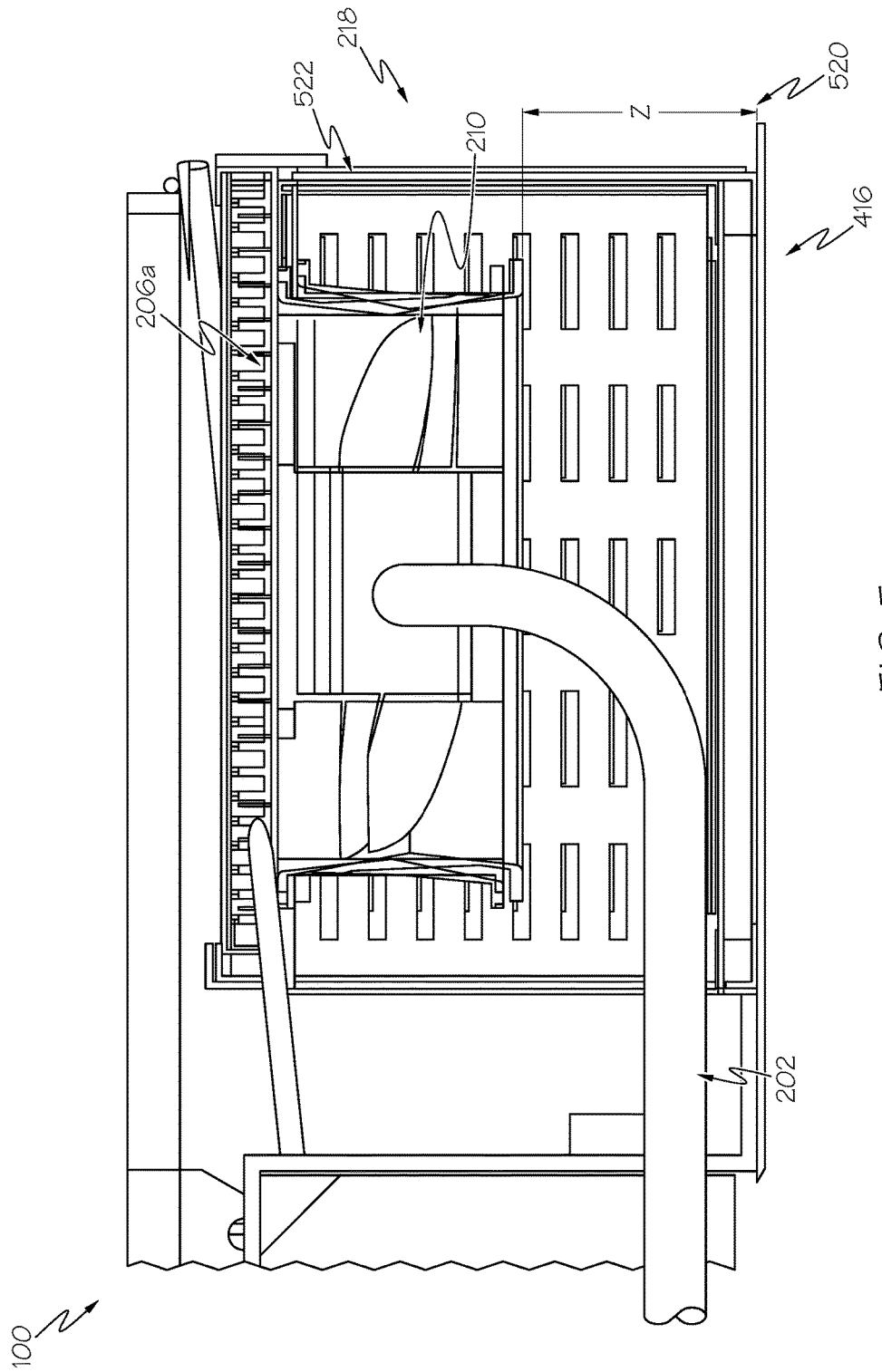
FIG. 5 depicts a side view of the air transfer unit, according to embodiments described herein.

FIG. 5 depicts a side view of the air transfer unit 200, according to embodiments described herein. As illustrated, the air transfer unit 200 is depicted to clearly illustrate the sidewall 218. Specifically, the sidewall 218 may facilitate an electric and/or data connection between the power supply apparatus 202 and the air directing apparatus 210. Additionally, the sidewall 218 may include intake apertures 522 for receiving airflow. Also provided is the exhaust screen 206a, which may include a sidewall 218 that is constructed of a low blockage honeycomb structure that provides stability to the exhaust screens 206 and prevents objects from entering the interior portion of the e air transfer unit 200.

Also depicted in FIG. 5 is a clearance 520 between the lower surface 416 of the air transfer unit 200 and the air directing apparatus 210. This clearance 520 provides ensures obstruction free operation that reduces vibration and extends the life of the air transfer unit 200.

Figure 6A:
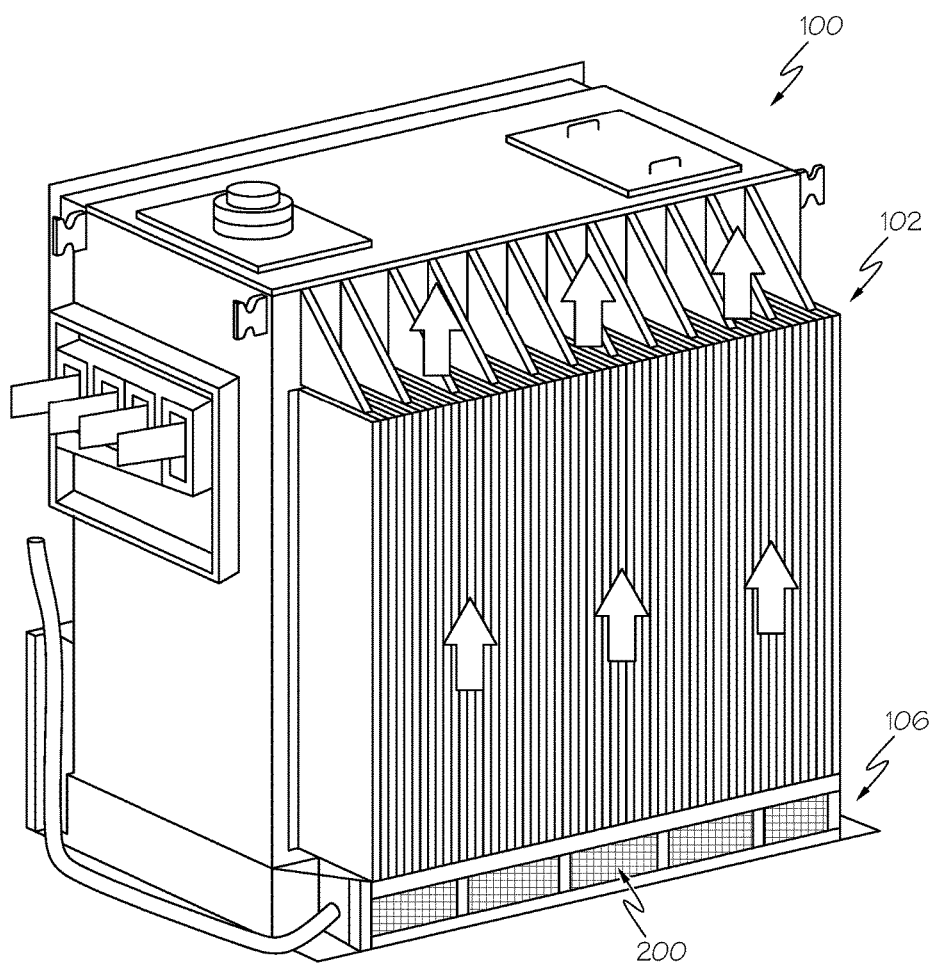
FIGS. 6A-6C depict a perspective view and a top view of a transformer and air transfer unit, according to embodiments described herein.
Figure 6B:
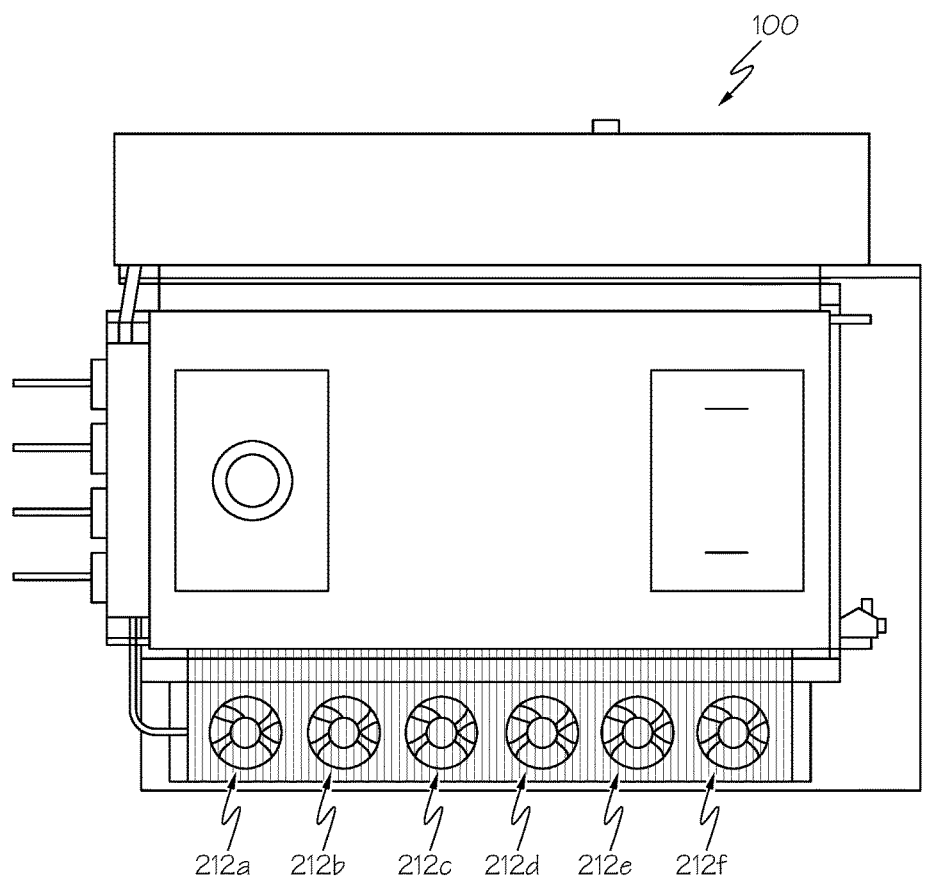
Figure 6C:
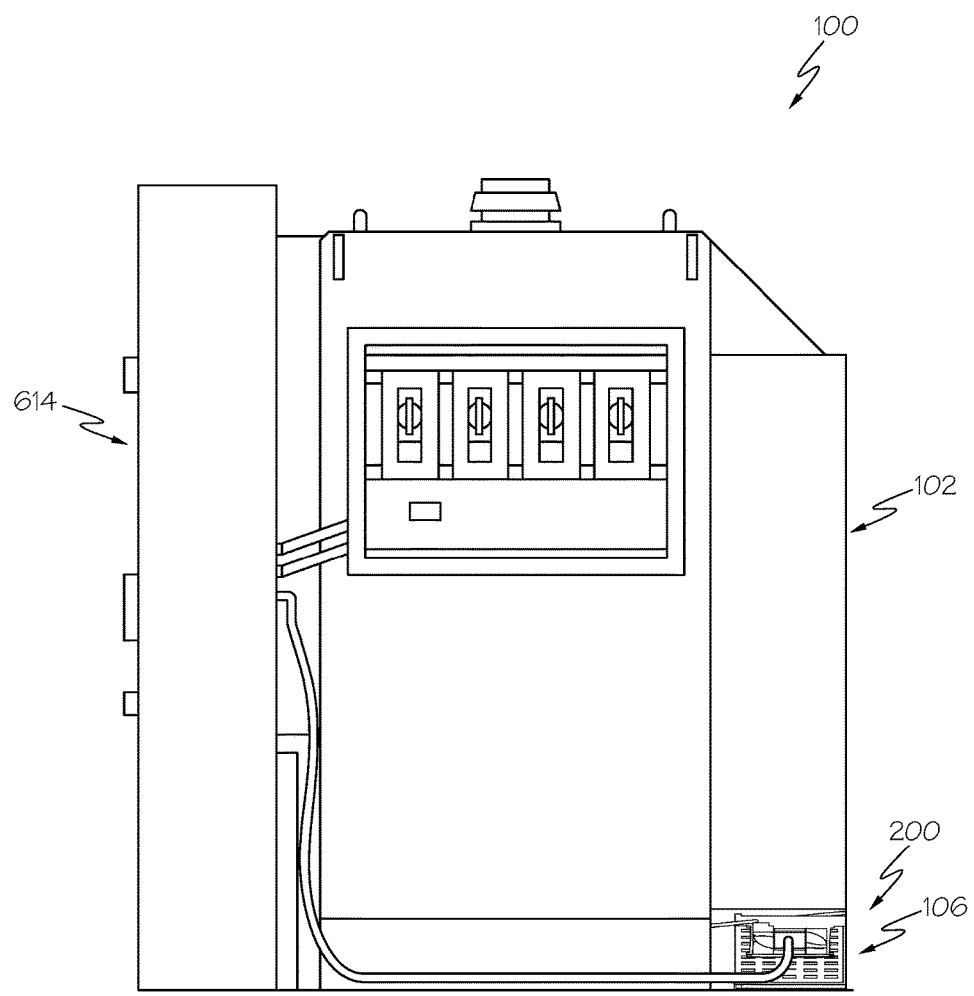

FIGS. 6A-6C depict a perspective view and a top view of a transformer 100 and air transfer unit 200, according to embodiments described herein. As illustrated, FIG. 6A depicts a transformer 100 that includes a plurality of cooling fins 102 and is coupled to the air transfer unit 200 installed in a lower clearance space 106. The air transfer unit 200 may be sized and shaped similar to the size and shape of a lower surface of the cooling fins 102, such that in operation, the air transfer unit 200 directs airflow parallel with the orientation of the cooling fins 102, thereby removing excess heat from the surface of the cooling fins 102.

In some embodiments, the air transfer unit 200 may be permanently attached to the transformer 100, such as via welding, bolting, etc. Similarly, some embodiments may provide for removably securing the air transfer unit 200 to the transformer 100.

FIG. 6B depicts an overhead perspective of the air transfer unit 200 with a plurality of air directing apparatus 210. FIG. 6C depicts a side view of the transformer 100 with the air transfer unit installed in the lower clearance space 106. As described above, the air transfer unit 200 may substantially fill the area between the lower surface of the cooling fins 102 and ground. Also illustrated in FIG. 6C is a transformer control unit 614. The transformer control unit 614 may provide controls to the air transfer unit 200 for determining a time to activate, a time to deactivate, and/or other controls. As an example, the transformer control unit 614 may determine a temperature of the cooling fins 102 and/or other portion of the transformer 100 and activate the air transfer unit 200 if the determined temperature exceeds a predetermined threshold. In some embodiments, the transformer control unit 614 may monitor a time the transformer 100 is active and, if that time exceeds a predetermined threshold, may activate the air transfer unit 200. In some embodiments, the transformer control unit 614 may provide a user option to activate the air transfer unit 200.

As illustrated above, various embodiments for vertical transformer cooling are disclosed. These embodiments may provide a reasonably uniform exhaust airflow maximizing surface area coverage of all fins. Additionally, the air directing apparatuses 210 may be spaced such that they provide at least about 80% cooling fin coverage. This is significantly greater than would be achieved on a side-mounted fan design. The exhaust screens 206a, 206b may be above the air directing apparatuses 210 and may be constructed of a closely-spaced honeycomb structure that creates reduced blockage and redirects the fan air axially. This may reduce or eliminate airflow swirl and dispersion. Elimination of airflow swirl and dispersion straightens the airflow, which increases axial velocity and overall cooling efficiency Embodiments may also be configured to fit completely underneath the cooling fins 102 of the transformer 100 to not interfere with surrounding features including the transformer containment pan, or the transformer base. In many areas, governmental regulations require liquid containment pans on the transformer 100, in the event of a leak. The containment pan is generally in close proximity to the cooling fins 102. As a consequence, embodiments of the air transfer unit 200 described herein may substantially match the lower surface of the cooling fins 102.

Similarly, items ranging from wrenches, screwdrivers, screws, nails, and other metallic items which may damage the air directing apparatuses 210. Thus, the exhaust screens 206a, 206b, may have a limited blockage area such that the air directing apparatuses 210 are not back pressured which could cause fan stall and failure. Similarly, the honeycomb structure with low blockage area may be employed directly above the air directing apparatuses 210. This provides airflow correction and provides protection from heavy foreign object debris.

Similarly, embodiments described herein are configured to protect against foreign objects from being drawn into the inlets of the air directing apparatuses 210. However, the air transfer unit 200 may be fully enclosed to prevent foreign object debris from being drawn into the air directing apparatuses 210 and causing an obstruction. Inlet screens may be machined into side surfaces of the air transfer unit 200. Some embodiments may include about 0.5 inch square air inlets and about 0.022 inch screen width. This creates ample open area for intake air (at least three times the area of the fans) which reduces inlet flow losses across the screens, and reduces stall potential of the air directing apparatuses 210, even with significant foreign object debris blockage of the screen.

Embodiments may also be configured to provide easy disassembly for maintenance. Additionally, the air transfer unit 200 may rest on a plurality of elevation supports 212, such that in some embodiments, no anchoring required. This allows the unit to be removed for maintenance. Similarly, the exhaust screens 206a, 206b may be configured to slide on rails for maintenance/cleaning and may be secured in place by plates held by one or more fasteners. It is expected that debris may enter the air transfer unit 200 and become trapped in the honeycomb exhaust grates, thus providing an opportunity to remove the exhaust screens 206a, 206b.

Power to the air transfer unit 200 may be provided by, for example, two separate 10 amp circuits run through a single liquid-tight conduit, to a control cabinet. The two 10 amp circuits may be fused independently and feed every other air directing apparatus in the air transfer unit 200. For example, if the air directing apparatuses 210 are numbered 1-6, fans 1, 3, and 5 are on circuit A, and 2, 4, and 6 on circuit B.

The air directing apparatuses may be remotely switched by a standard monitoring relay which monitors an analog temperature signal or an alarm contact. When the relay determines that the fans need to cool down the transformer, it closes an output contact which switches the fans on by closing the 5 amp circuits to the fans While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein includes systems and methods for vertical transformer cooling. It should also be understood that these embodiments are merely exemplary and are not intended to limit the scope of this disclosure.

What is claimed is:

1. An air transfer unit for vertical transformer cooling comprising:
   an assembly frame that includes an interior portion and defines a lateral side, an upper side, and a lower side, wherein the assembly frame includes a length that is substantially the same as a width of a plurality of cooling fins on a transformer, and wherein the assembly frame includes a height that is substantially the same as a distance between a lower surface that is defined by the plurality of cooling fins and ground;
   a plurality of air directing apparatuses that are positioned in the interior portion and are aligned along the length of the assembly frame, wherein the plurality of air directing apparatuses receive airflow from the lateral side and direct the airflow in a substantially perpendicular direction from a direction of airflow received, vertically through the upper side to further cool the plurality of cooling fins; and
   an exhaust screen that is coupled to the upper side, wherein the exhaust screen further consolidates the airflow vertically toward the plurality of cooling fins.

2. The air transfer unit of claim 1, further comprising an elevation support, wherein the elevation support is coupled to the lower side of the assembly frame and elevates the assembly frame predetermined distance above ground.

3. The air transfer unit of claim 1, wherein at least one of the plurality of air directing apparatuses receives the airflow from the lower side of the assembly frame.

4. The air transfer unit of claim 1, wherein the lateral side includes a screened intake filter for reducing debris from reaching the interior portion.

5. The air transfer unit of claim 1, further comprising a power supply apparatus for providing power to the plurality of air directing apparatuses.

6. The air transfer unit of claim 1, wherein the air transfer unit is physically attached to the transfer in a space under the lower surface of the plurality of cooling fins.

7. The air transfer unit of claim 1, wherein the air transfer unit is communicatively coupled to a transformer control unit, wherein the transformer control unit controls operation of the air transfer unit.

8. A system for vertical transformer cooling comprising:
a transformer that converts received electricity from a first voltage to a second voltage, wherein the transformer includes a plurality of cooling fins that extend from a surface of the transformer and have a length that extends to define a lower surface of the plurality of cooling fins, wherein the lower surface defines a lower clearance space between the lower surface and ground, and wherein the plurality of cooling fins collectively define a cooling fin width;
an air transfer unit that resides in the lower clearance space and extends across at least a portion of the cooling fin width, under the lower surface of the plurality of cooling fins, wherein the air transfer unit comprises:
an assembly frame that includes an interior portion and defines a lateral side, an upper side, and a lower side, and wherein the assembly frame includes a height that is substantially the same as a distance between the lower surface that is defined by the plurality of cooling fins and ground;
a plurality of air directing apparatuses that are positioned in the interior portion and are aligned along the length of the assembly frame, wherein the plurality of air directing apparatuses receive airflow from the lateral side and direct the airflow vertically through the upper side along the length of the plurality of cooling fins to further cool the plurality of cooling fins; and
an exhaust screen that is constructed of low blockage honeycomb structure, wherein the exhaust screen is removably coupled to the upper side, and wherein the exhaust screen further consolidates the airflow vertically toward the plurality of cooling fins.

9. The system of claim 8, wherein the air transfer unit further comprises an elevation support, wherein the elevation support is coupled to the lower side of the assembly frame and elevates the assembly frame predetermined distance above ground.

10. The system of claim 9, wherein at least one of the plurality of air directing apparatuses receives the airflow from the lower side of the assembly frame.

11. The system of claim 8, wherein the lateral side includes a screened intake filter for reducing debris from reaching the interior portion.

12. The system of claim 8, wherein the air transfer unit further comprises a power supply apparatus for providing power to the plurality of air directing apparatuses.

13. The system of claim 8, wherein the transformer further comprises a transformer control unit, wherein the air transfer unit is communicatively coupled to the transformer control unit, wherein the transformer control unit controls operation of the air transfer unit.

14. The system of claim 8, wherein the air transfer unit is removably attached to the transformer.

15. A transformer comprising:
a plurality of cooling fins that extend from a surface of the transformer and have a length that extends to define a lower surface of the plurality of cooling fins, wherein the lower surface defines a lower clearance space between the lower surface and ground, and wherein the plurality of cooling fins collectively define a cooling fin width;
an air transfer unit that resides in the lower clearance space and extends across at least a portion of the cooling fin width, under the lower surface of the plurality of cooling fins, wherein the air transfer unit comprises:
an assembly frame that includes an interior portion and defines a lateral side, an upper side, and a lower side, and wherein the assembly frame includes a height that is substantially the same as a distance between the lower surface that is defined by the plurality of cooling fins and ground;
a plurality of air directing apparatuses that are positioned in the interior portion and are aligned along the length of the assembly frame, wherein the plurality of air directing apparatuses receive airflow from the lateral side and direct the airflow vertically through the upper side along the length of the plurality of cooling fins to further cool the plurality of cooling fins;
an exhaust screen that is constructed of low blockage honeycomb structure, wherein the exhaust screen is removably coupled to the upper side, and wherein the exhaust screen further consolidates the airflow vertically toward the plurality of cooling fins; and
a screened intake filter that is coupled to the lateral side, wherein the screened intake filter reduces debris from reaching the interior portion.

16. The transformer of claim 15, wherein the air transfer unit further comprises an elevation support, wherein the elevation support is coupled to the lower side of the assembly frame and elevates the assembly frame predetermined distance above ground.

17. The transformer of claim 16, wherein at least one of the plurality of air directing apparatuses receives the airflow from the lower side of the assembly frame.

18. The transformer of claim 15, wherein the air transfer unit further comprises a power supply apparatus for providing power to the plurality of air directing apparatuses.

19. The transformer of claim 15, further comprising a transformer control unit, wherein the air transfer unit is communicatively coupled to the transformer control unit, wherein the transformer control unit controls operation of the air transfer unit.

20. The transformer of claim 15, wherein the air transfer unit is removably attached to the transformer.

* * * * *